United States Patent
Hur et al.

(10) Patent No.: US 6,181,068 B1
(45) Date of Patent: Jan. 30, 2001

(54) PLASMA GENERATING APPARATUS

(75) Inventors: Bang Uk Hur; Yoo Byung Bark, both of Seoul (KR); Sergei Gritsinin; Igor Kossyi, both of Moscow (RU); K. F. Sergeitchev, Kyunggido (KR)

(73) Assignee: Dae Won Paptin Form Co., Ltd. (KR)

( * ) Notice: Under 35 U.S.C. 154(b), the term of this patent shall be extended for 0 days.

(21) Appl. No.: 09/312,016

(22) Filed: May 14, 1999

(30) Foreign Application Priority Data

May 15, 1998 (KR) .................................................. 98-17689

(51) Int. Cl.⁷ .................................................. H05H 1/46
(52) U.S. Cl. .................. 315/111.21; 315/111.41; 315/111.81; 118/723 N; 118/723 IR; 118/723 ME; 118/723 AN
(58) Field of Search .......................... 315/111.21, 111.41, 315/111.51, 111.81, 111.71; 156/345; 118/723 MW, 723 ME, 723 R, 723 AN, 723 IR, 723 I

(56) References Cited

U.S. PATENT DOCUMENTS 5,276,386 * 1/1994 Watanabe et al. .............. 315/111.21

* cited by examiner

Primary Examiner—Michael B Shingleton
(74) Attorney, Agent, or Firm—Nathan N. Kallman

(57) ABSTRACT

A plasma generating apparatus is provided which uses slipping surface discharge and microwave to generate a large quantity of plasma in a different gases or gaseous mixtures (including electro-negative gases) in a wide range of gas pressure (from a deep vacuum up to atmospheric pressure). The plasma generating apparatus includes high voltage pulse means for generating a high voltage pulse, plasma generating means based on the slipping surface discharge which excites as the high voltage pulse generated by high voltage pulse generating means, is supplied, microwave generating means for generating a microwave radiation for producing plasma, a chamber in which the plasma generating means are placed, and the plasma collects, the chamber receiving the microwave radiation from the microwave generating means, and a gas inlet through which a specific gas flows into the chamber, to generate a large quantity of plasma according to the plasma generating means and microwave generating means.

6 Claims, 8 Drawing Sheets

PLASMA GENERATING APPARATUS

BACKGROUND OF THE INVENTION

1. Field of the Invention

The present invention relates to a plasma generating apparatus, and in particular, to a plasma generating apparatus for generating a large quantity of plasma using slipping surface discharge (SSD) and microwave discharge.

2. Discussion of Related Art

Microwave gas-discharge plasma source are of considerable current use in a modern technique and technology for a PCVD thin films deposition, etching of a metallic and dielectric samples, activation of dielectric samples, etc. The advantages of these sources consist in a relatively pure conditions of a plasma generation and maintenance as well as in a high efficiency of microwave source energy release in a plasma formation and as a consequence in the gas medium, etc. One of the main disadvantages of this method consists in a limited choosing of a working gases and relatively narrow limits of gas pressure at which gas discharge excitation is possible.

"Slipping" discharge along the metal-dielectric surfaces also falls in category of extensively using discharges: as a source of a powerful ultraviolet radiation in a molecular lasers, as a strong shock waves generator, etc. Among of this method advantages is possibility to excite discharge essentially in all gases and gaseous mixtures in a wide range of pressure: from deep vacuum ($P \leq 10_{-6}$ Torr) up to atmospheric pressure. Disadvantage of method consists in particular in a principle pulse work with relatively low attainable average energy release in the gas medium.

SUMMARY OF THE INVENTION

Accordingly, the present invention is directed to a plasma generating apparatus that substantially obviates one or more of the problems due to limitations and disadvantages of the related art.

An object of the present invention is to-provide a plasma generating apparatus which uses slipping surface discharge and microwave radiation to plasma production in different gases and gaseous mixtures at a wide range of gas pressure.

To accomplish the object of the present invention, there is provided a plasma generating apparatus including high voltage pulse means for generating a high voltage pulse, plasma generating means based on the slipping surface discharge, give rise of discharge as the high voltage pulse generated by high voltage pulse generating means is applied, microwave generating means for generating a microwave radiation form the microwave for producing plasma, a chamber in which the plasma generating means are placed, and the plasma collects, the chamber receiving the microwave radiation from the microwave generating means, and a gas inlet through which a specific gas flows into the chamber, to generate a large quantity of plasma according to the plasma generating means and microwave generating means.

It is to be understood that both the forgoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

Figure 1:
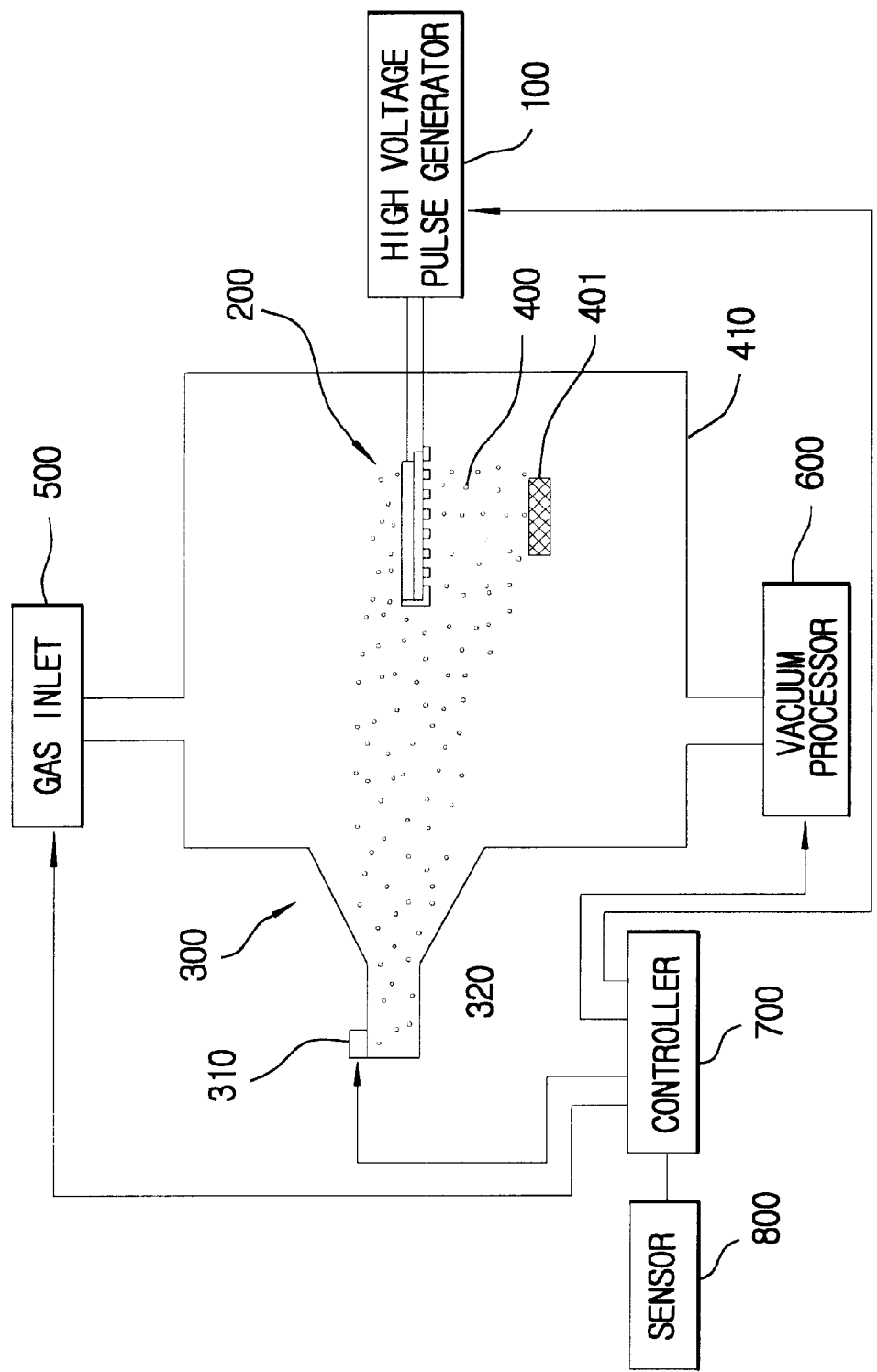
FIG. 1 shows a configuration of a plasma generating apparatus according to the present invention.
Figure 4A:
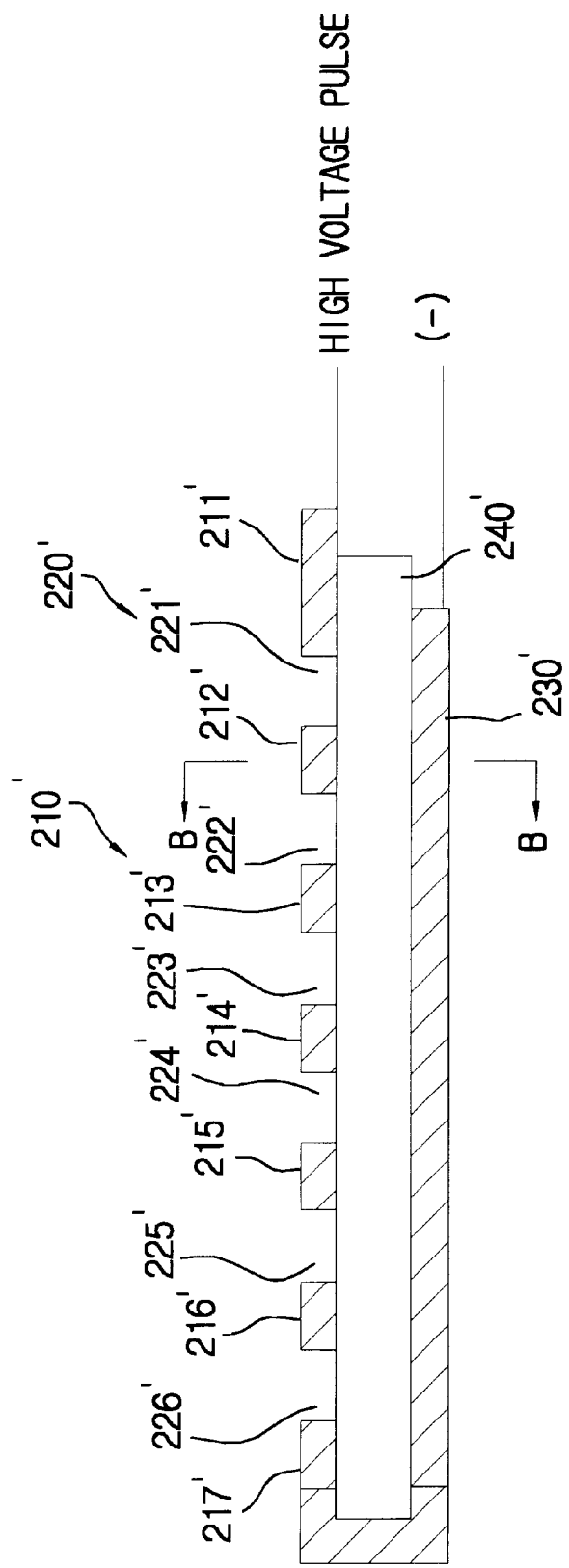
Figure 4B:
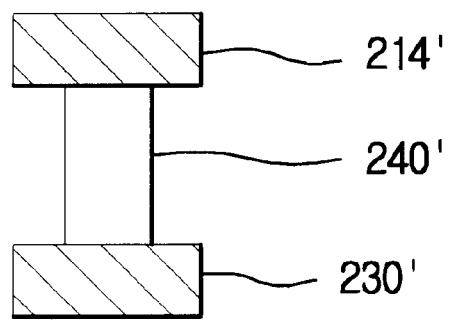
Figure 4C:
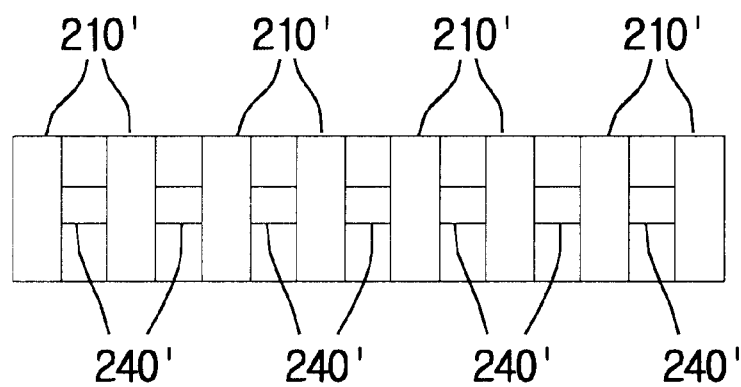
Figure 5A:
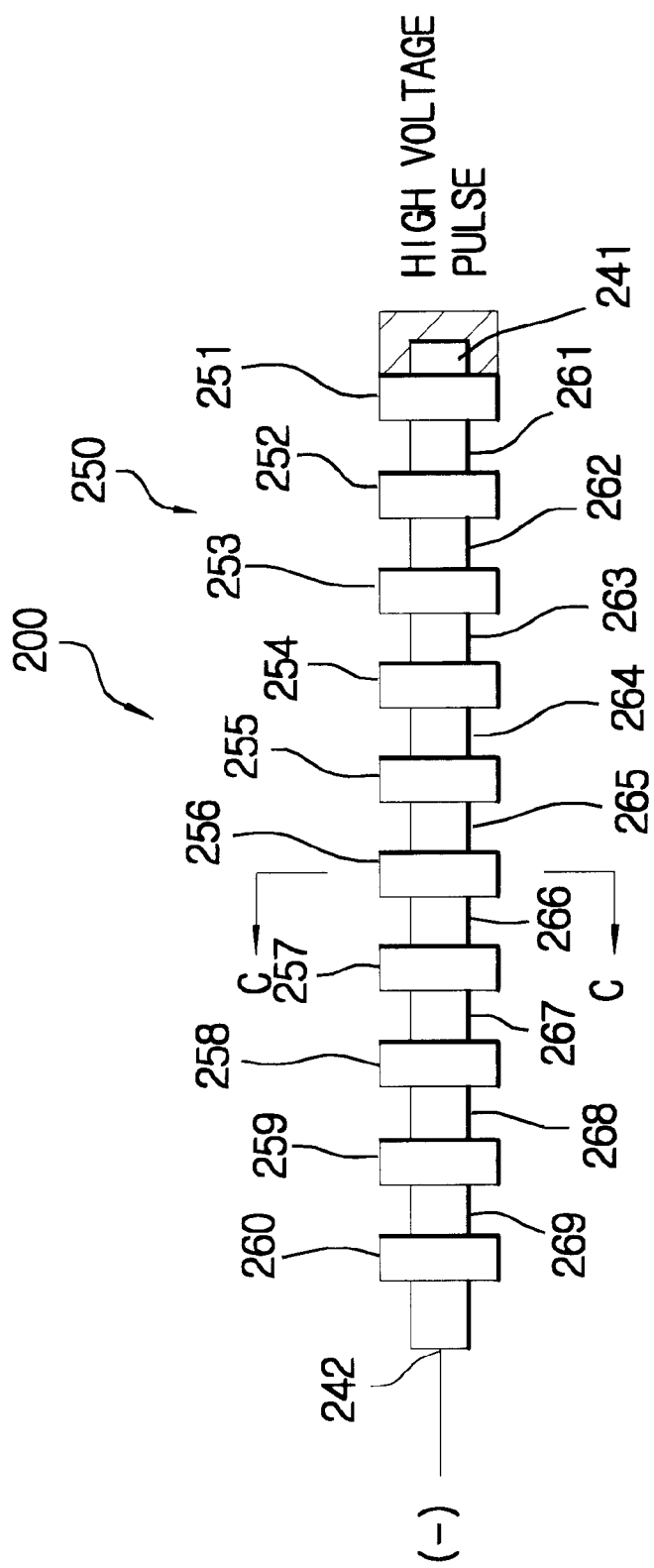
Figure 5B:
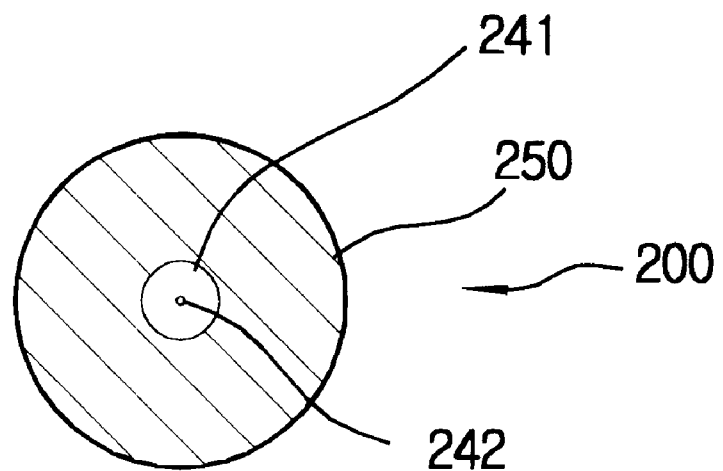

FIGS. 4A, 4B and 4C show the plasma generator of FIG. 1 according to a second embodiment of-the present invention, FIG. 4A illustrating the cross section of the plasma generator, FIG. 4B illustrating the cross section of the structure of FIG. 4A, taken along line B—B, FIG. 4C illustrating the plan view of the plasma generator; and FIGS. 5A and 5B show the plasma generator of FIG. 1 according to a third embodiment of the present invention, FIG. 5A illustrating the front view of the plasma generator, FIG. 5B illustrating the cross section of the structure of FIG. 5A, taken along line C—C.

DETAILED DESCRIPTION OF PREFERRED EMBODIMENT

Reference will now be made in detail to the preferred embodiments of the present invention, examples of which are illustrated in the accompanying drawings.

Referring to FIG. 1, a plasma generating apparatus according to the present invention includes a high voltage pulse generator 100 for generating a high voltage pulse, a plasma generator 200 on which slipping surface discharge is excited generating plasma, microwave generator 300 for generating a microwave radiation, a chamber 410 in which the plasma collects, a gas inlet 500 through which a gas flows into the chamber to generate the plasma, a vacuum processor 600 for reducing the atmospheric pressure in chamber 410, a sensor 800 for detecting the atmospheric pressure state and gas flow state in chamber 410, and a controller 700 for controlling the operations of high voltage pulse generator 100, high frequency generator 300, gas inlet 500 and vacuum processor 600.

High voltage pulse generator 100 generates a high voltage pulse with a repetition frequency of above 10 Hz and voltage of 20 KV and supplies it to plasma generator 200. Slipping surface discharge is generated by plasma generator 200 as the high voltage pulse is applied receiving from high voltage generator 100, generating plasma. Microwave generator 300 for generating microwave radiation used for producing plasma includes a microwave generator 310 for generating microwave radiation, and a waveguide 320 for guiding the microwave radiation generated by microwave generator 310 to chamber 410.

Plasma generator 200 is included in chamber 410 to which the microwave radiation is applied from microwave generator 300. Plasma 400 which collects in the chamber is used, for example, for etching process performed on target 401. Gas inlet 500 flows a specific gas into chamber 410 to allow plasma generator 200 and microwave generator 300 to generate plasma. The gas which flows into the chamber may be $N_2O_2$ gas, He gas, gas mixture of Ar and CFC, CFC gas or gas mixture of Ar, $H_2$ and $CH_4$. Vacuum processor 500 reduces the internal pressure of chamber 410, specifically, below $10^{-1}$ Torr to $10^{-6}$ Torr before filling the chamber 410 by the working gas, to allow plasma generator 200 and microwave generator 300 to generate a great deal of plasma in the wide range of gas pressures: from deep vacuum ($p \leqq 10^{-6}$ Torr) up to atmospheric pressure.

There will be explained below the operations of the plasma generating apparatus of the present invention according to three different methods. First method uses only plasma generator 200 for generating plasma, second method uses only microwave generator 300 and third one uses both plasma generator 200 and microwave generator 300. In case of using only plasma generator 200, first of all, vacuum processor 500 operates under the control of controller 700, to reduce the internal pressure of chamber 410 below $10^{-1}$ Torr to $10^{-6}$ Torr and to fill it by working gas at working pressure (up to atmospheric one). Sensor 800 detects the chamber's internal pressure and sends corresponding sensing signal to controller 700. Then, controller 700 controls high voltage pulse generator 100 to generate a high voltage pulse with a repetition frequency of above 10 Hz and voltage of 20 KV, for example, and to apply it to the electrode of plasma generator 200. Plasma generator 200 produces slipping surface discharge plasma as the high voltage pulse sent from high voltage pulse generator 100 is applied.

In case of using only microwave generator 300, a gas or gas mixture which is able to generate plasma in chamber 410 flows into the chamber through gas inlet 500, generating plasma using a microwave radiation. Thus, one of $N_2O_2$ gas, He gas, gas mixture of Ar and CFC, CFC gas, and gas mixture of Ar, $H_2$ and $CH_4$ flows into chamber 410 through gas inlet 500. Controller 700 controls gas inlet 500 to flow the gas or gas mixture into chamber 410. Here, the gas or gas mixture actively flows into the chamber and thus generation of plasma is accelerated when the controller operates vacuum processor 600 to reduce the internal pressure of chamber 410 below $10_{-5}$ Torr. However, the plasma can be generated according to the gas or gas mixture and microwave radiation even when vacuum processor 600 does not operate. When sensor 800 detects a specific internal pressure of chamber 410 which is containing the gas or gas mixture, controller 700 operates microwave generator 300, to apply a microwave radiation into chamber 410. That is, microwave generator 310 generates a microwave radiation which is applied into chamber through the waveguide. Microwave radiation leads to the plasma production inside the chamber because the gas or gas mixture for generating plasma is distributed therein. Interval of gas pressure values in which generation of microwave plasma is possible depends on the kind of gas, level of microwave power and wavelength of microwave radiation and as a rule is clamped within a rather narrow limits (for example, in Ar and for microwave radiation with wavelength 12 cm and power P=1 kW this pressure range is approximately $10^{-1} \leqq p \leqq 1$ Torr)

Finally, in case of using both microwave generator 300 and plasma generator 200 simultaneously, controller 700 operates vacuum processor 500 to reduce the internal pressure of chamber 410 below $10^{-1}$ Torr to $10^{-6}$ Torr and to fill chamber by working gas, to allow plasma generator 200 to generate plasma. Controller 700 controls gas inlet 500 to flow a gas or gas mixture which can generate plasma in the chamber, for example, $N_2O_2$ gas, He gas, gas mixture of Ar and CFC, CFC gas or gas mixture of Ar, $H_2$ and $CH_4$, into chamber 410, to generate plasma using a high voltage pulses for operation of pulse plasma generator 200 and microwave radiation. When the internal pressure of chamber 410 is reduced and the gas or gas mixture flows into chamber 410, sensor 800 detects it and sends corresponding signal to controller 800 which operates high voltage pulse generator 100 and microwave generator 300.

High voltage pulse generator 100 generates a high voltage pulse with a repetition frequency of above 10 Hz and voltage of above 20 KV, for example, and sends it to the electrode of plasma generator 200. Microwave generator 300 generates a microwave radiation and applies it into chamber 410. Then, the slipping surface plasma generator 200 comes into play as the high voltage pulse is sent from high voltage pulse generator 100, producing plasma. Simultaneously, the microwave radiation is introduced continuously into chamber interacting with slipping surface discharge plasma, heating it, supporting it and producing a new (microwave) plasma. When both plasma generator 200 and microwave generator 300 participate in generating of plasma, steadily existing plasma appears inside of chamber in the wide pressure range (up to atmospheric one).

Figure 2A:
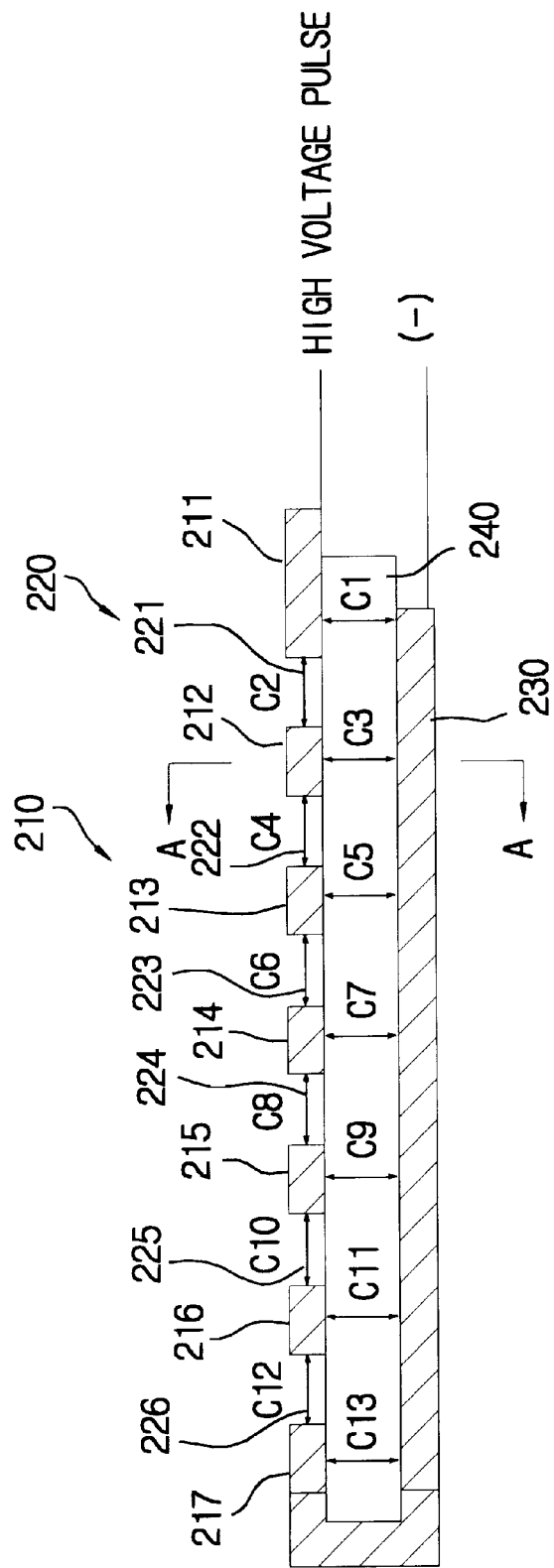
FIGS. 2A, 2B and 2C show the plasma generator of FIG. 1 according to a first embodiment of the present invention, FIG. 2A illustrating the cross section of the plasma generator, FIG. 2B illustrating the cross section of the structure of FIG. 2A, taken along line A—A, FIG. 2C illustrating the plan view of the plasma generator.
Figure 2B:
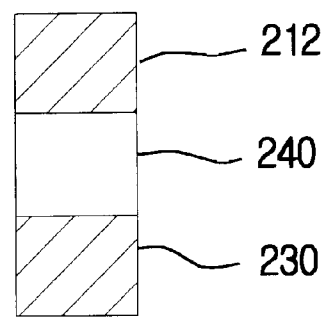
Figure 2C:
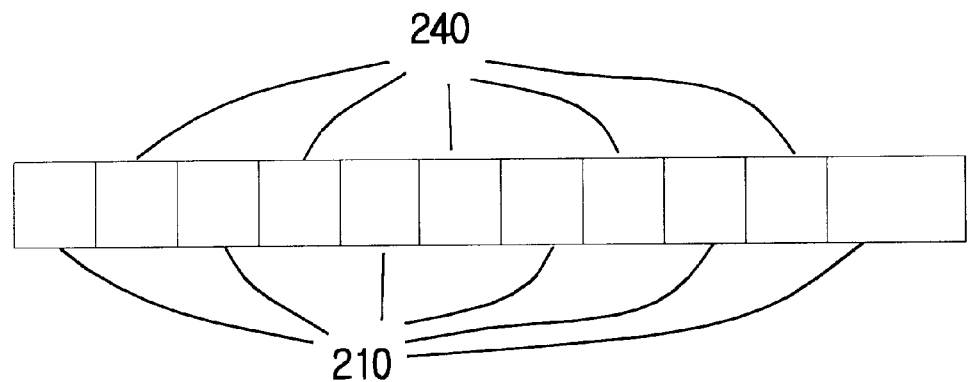

Meanwhile, referring to FIGS. 2A, 2B and 2C, plasma generator 200 includes a positive electrode 210 consisting of a plurality of unit electrodes 211 to 217 which receives the high voltage pulse from high voltage pulse generator 100 to its unit electrode on its one side, a negative electrode 230 placed on the back of positive electrode 210, and an insulator 240 formed between positive electrode 210 and negative electrode 230. System of electrodes 210, 230, 211 to 217 is constructed in such a manner that supplying of a high voltage pulse to the electrodes 210 and 230 leads to the appearance of a sequence of discharges between the two neighboring electrodes ranging from electrode 210 to electrode 230 forming plasma channel along all plasma generator 200.

Figure 3:
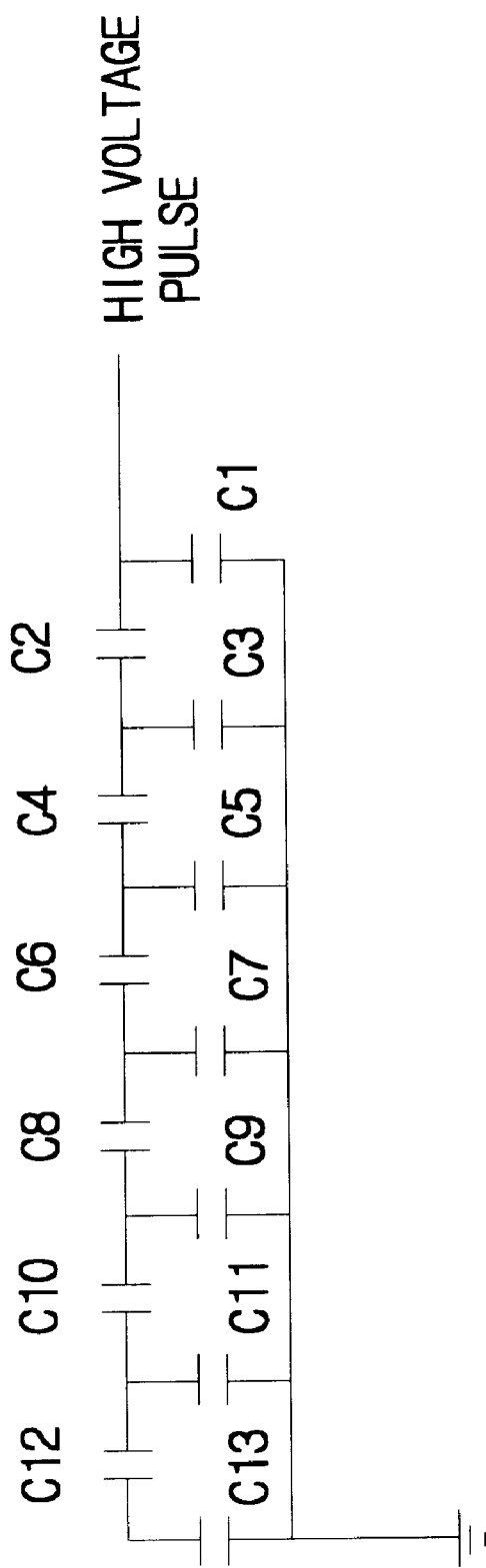
FIG. 3 shows the equivalent circuit of FIG. 2.

Referring to FIG. 3 which shows the equivalent circuit of plasma generator 200, insulator 240 formed between unit electrodes 211 to 217 and negative electrode 230 and spaces 221 to 216 placed between unit electrodes 211 to 217 form a plurality of capacitors C1 to C13. Ln other words, insulator 240 formed between unit electrode 211 and negative electrode 230 forms capacitor C1, space 221 placed between unit electrodes 211 and 212 forms capacitor C2, insulator 240 formed between unit electrode 212 and negative electrode 230 forms capacitor C3, space 222 placed between unit electrodes 212 and 213 forms capacitor C4, insulator 240 formed between unit electrode 213 and negative electrode 230 forms capacitor C5, space 223 placed between unit electrodes 213 and 214 forms capacitor C6, insulator 240 formed between unit electrode 214 and negative electrode 230 formed capacitor C7, space 224 placed between unit electrodes 214 and 215 forms capacitor C8, insulator 240 formed between unit electrode 215 and negative electrode 230 forms capacitor C9, space 25 placed between unit electrodes 215 and 216 forms capacitor C10, insulator 240 formed between unit electrode 216 and negative electrode 230 forms capacitor C11, space 226 placed between unit electrodes 216 and 217 forms capacitor C12, and insulator 240 formed between unit electrode 217 and negative electrode 230 forms capacitor C13.

When high voltage pulse generator 100 applies a high voltage pulse to plasma generator 200, sequential charging and discharging occur according to capacitors C1 to C13 formed by spaces 221 to 216 between unit electrodes 211 to 217 and insulator 240 formed between unit electrodes 211 to 217 and negative electrode 230, generating metallic plasma. That is, capacitors C1 to C13 are sequentially charged and discharged in accordance with the applied high voltage pulse, and plasma is generated during charging of each of capacitors C1 to C13. Meantime, producing of plasma accompanies generation of ultraviolet rays, resulting in creating of plasma "halo" in a surrounding gas medium.

Plasma generator 200 according to a second embodiment of the present invention is constructed in such a manner, as shown in FIGS. 4A, 4B and 4C, that positive electrode 210' and negative electrode 230' both of which have a shape of bar are arranged having insulator 240' formed there between. The two electrodes are longer than the cross-section length of insulator 240'. In this embodiment, there is space 220' between positive electrode 210' and negative electrode 220', where insulator 240' does not exist, obtaining insulating effect. Accordingly, the same operation as that in the first embodiment can be performed.

Referring to FIGS. 5A and 5B, plasma generator 200 according to a third embodiment of the present invention includes a column shaped insulator 241, a positive electrode 250 constructed in such a manner that ring shaped unit electrodes 251 to 260 and spaces 261 to 269 are alternately arranged around insulator 241 to produce charging and discharging and a high voltage pulse generated by high voltage pulse generator 100 is applied to the unit electrode on its one side, and a negative electrode 242 placed in the center of insulator 241 in the direction of the insulator's length. Specifically, plasma generator 200 shown in FIGS. 5A and 5B employs ring shaped unit electrodes 251 to 260 as distinguished from bar shaped unit electrodes 211 to 217 shown in FIGS. 2 and 4, and its negative electrode that is the ground electrode is placed in the center of column shaped insulator 241 in the direction of insulator's length. In this case, ring shaped unit electrodes 251 to 260 have areas wider than bar shaped ones, to increase the capacitance formed between them, generating a great deal of plasma. When a high voltage pulse is continuously applied to unit electrode 251 on one side of positive electrode 250, capacitors formed by spaces 261 to 269 between unit electrodes 251 to 260 and insulator 241 between positive and negative electrodes 250 and 242 produce charging and discharging, generating plasma.

The plasma generating apparatus according to the present invention has the following advantages. Firstly, the plasma generating apparatus of the present invention employs the microwave generating system and high voltage pulse generating system together to obtain such an effect, as continuous generated of microwave plasma in a wide range of gas pressures in a different gases and gaseous mixtures. Secondly, a great deal of plasma continuously generated in a gas mixtures containing electro-negative gases can be used for chemical etching of metal and semiconductor and deposition of titanium, increasing the metal strength and improving its resistance to corrosion. Thirdly, combine work of slipping surface discharge with microwave discharge gives possibility to receive continuously exciting metallic plasma, produced by slipping surface discharge and heated and supported by microwave radiation. Fourthly, production of microwave discharge in a nitrogen gas medium simultaneously with slipping surface discharge system containing Ti-electrodes leads to the possibility of TiN-film deposition on a different substrates. Fifthly, excitation of a joint slippin surface and microwave discharge in the gas mixture Ar+H2+CH4 leads to the possibility of a diamond or diamond-like film deposition with the high rate of deposition.

It will be apparent to those skilled in the art that various modifications and variations can be made in the plasma generating apparatus of the present invention without departing from the spirit or scope of the invention. Thus, it is intended that the present invention cover the modifications and variations of this invention provided they come within the scope of the appended claims and their equivalents.

What is claimed is:

1. A plasma generating apparatus, comprising:

high voltage pulse means for generating a high voltage pulse;

plasma generating means based on a slipping surface discharge which is generated as the high voltage pulse generated by high voltage pulse generating means is supplied;

microwave generating means for generating a microwave radiation for producing plasma;

a chamber in which the plasma generating means are placed, and the plasma collects, the chamber receiving microwave radiation from the microwave generating means; and a gas inlet through which a specific gas flows into the chamber, to generate a large quantity of plasma according to the plasma generating means and microwave generating means.

2. The plasma generating apparatus as claimed in claim 1, further comprising vacuum processing means for reducing the internal pressure of the chamber, before filling it by a working gas in which microwave and slipping surface discharges are exciting by microwave generating means and plasma generating means.

3. The plasma generating apparatus as claimed in claim 1, wherein the gas which flows into the chamber and fills it for following gas discharge excitation in it with help of plasma generating means and microwave generating means.

4. The plasma generating apparatus as claimed in claim 1, wherein the high voltage pulse generating means generate a high voltage pulse with a repetition frequency of above 10 Hz and voltage of above 20 KV.

5. The plasma generating apparatus as claimed in claim 1, wherein the plasma generating means comprises:

a positive electrode constructed in such a manner that a plurality of unit electrodes and spaces are alternately arranged to produce charging and discharging, and the high voltage pulse is applied from the high voltage pulse generating means to the unit electrode on its one side;

a negative electrode placed on the back of the positive electrode; and an insulator formed between the positive and negative electrodes.

6. The plasma generating apparatus as claimed in claim 1, wherein the plasma generating means comprises:

a column shaped insulator;

a positive electrode constructed in such a manner that a plurality of ring shaped unit electrodes and spaces are alternately arranged to produce charging and discharging, and the high voltage pulse is applied from the high voltage pulse generating means to the unit electrode on its one side; and a negative electrode placed arranged in the center of the insulator in the direction of the insulator's length.

* * * * *